United States Patent
Shum

(10) Patent No.: US 7,825,425 B2
(45) Date of Patent: Nov. 2, 2010

(54) LED STRUCTURE TO INCREASE BRIGHTNESS

(75) Inventor: Frank Shum, Sunnyvale, CA (US)

(73) Assignee: Bridgelux Inc., Livermore, CA (US)

(*) Notice: Subject to any disclaimer, the term of this patent is extended or adjusted under 35 U.S.C. 154(b) by 117 days.

(21) Appl. No.: 12/183,020

(22) Filed: Jul. 30, 2008

(65) Prior Publication Data

US 2009/0272997 A1 Nov. 5, 2009

Related U.S. Application Data

(60) Provisional application No. 61/049,612, filed on May 1, 2008.

(51) Int. Cl.
*H01S 3/08* (2006.01)
(52) U.S. Cl. .................................................. 257/98
(58) Field of Classification Search .............. 257/98–99
See application file for complete search history.

(56) References Cited

U.S. PATENT DOCUMENTS

| | | | |
|---|---|---|---|
| 6,258,618 B1 | 7/2001 | Lester | |
| 6,729,746 B2 * | 5/2004 | Suehiro et al. | 362/241 |
| 2002/0001111 A1 * | 1/2002 | Evans et al. | 359/34 |
| 2004/0076396 A1 | 4/2004 | Suga | |
| 2006/0284207 A1 | 12/2006 | Park et al. | |
| 2007/0020790 A1 | 1/2007 | Erchak et al. | |

* cited by examiner

*Primary Examiner*—Brook Kebede
*Assistant Examiner*—Mohammad Choudhry
(74) *Attorney, Agent, or Firm*—Arent Fox LLP

(57) ABSTRACT

A light emitting semiconductor device comprising an LED having an emission aperture located on a surface of the LED and the emission aperture has a size that is smaller than a surface area of the LED where the emission aperture is formed. The device further includes a reflector surrounding both side walls, a bottom surface, and portions of a surface of the LED where the emission aperture is formed or surrounding the bottom surface and portions of the surface of the LED where the emission aperture is formed so that an area on the surface uncovered by the reflector is the emission aperture and is smaller than the area of the LED. Alternatively, in the light emitting semiconductor, the surface of the LED substantially aligned with the emission aperture may be roughened and the surface of the LED beyond the emission aperture may be smooth. The surface of the LED beyond the emission aperture may also be covered by a low loss reflector.

12 Claims, 3 Drawing Sheets

LED STRUCTURE TO INCREASE BRIGHTNESS

CROSS-REFERENCE TO RELATED PATENT APPLICATION

This application claims priority from U.S. Provisional Application Ser. No. 61/049,612, filed May 1, 2008. The entirety of the provisional application is incorporated herein by reference.

BACKGROUND

1. Field

The present disclosure relates to a light emitting diode (LED), and more particularly, to an LED with a high brightness output.

2. Background

Light emitting diodes (LED) have been developed for many years and have been widely used in various technology areas. Because LEDs have better electrical power to light conversion efficiency than the conventional incandescent lighting and longer lifetimes than both the conventional incandescent and fluorescent light sources, they have been good candidates for replacing these conventional light sources.

The brightness or luminance of an LED is an important quality that specifies how it will illuminate a particular location. For applications such as rear projection TVs, presentation projectors, and automobile headlights, among others, the brightness is a particularly important factor.

The light brightness or luminance (L) of a light source is proportional to the optical power ($\Phi$) of the light source, as shown below:

$L=\Phi/(A\Omega)$, where A is an area of the source and $\Omega$ is a solid angle of light emission.

Typically, the area (A) and the solid angle $\Omega$ are constant. Therefore, traditionally, the current supplied to the LED must be increased to increase the luminance. Increasing the current, i.e., increasing the current density, however, also decreases the reliability of the LED. Even if the reliability of the LED is not a concern, once the current density is: above a certain limit, the optical power will "roll over," resulting in a decrease in brightness. Increasing the current density also increases the power density or the heat generated per unit area, which is not a desirable result.

Accordingly, there is a need in the art to achieve an increase in the brightness of the LEDs without increasing current or power density.

SUMMARY

In one aspect of the disclosure, a light emitting semiconductor device includes an LED having an emission aperture located on a surface of the LED. The emission aperture has a size that is smaller than the surface area of the LED where the emission aperture is formed.

In another aspect of the disclosure, a light emitting semiconductor device includes an LED having two side walls, a bottom surface, a top surface and an emission aperture located on the top surface of the LED, and a reflector formed on the bottom surface and portions of the top surface of the LED. The area on the top surface uncovered by the reflector forms the emission aperture and is smaller than an area of the top surface of an LED.

In still another aspect of the disclosure, a light emitting semiconductor device includes an LED having an emission aperture located on a surface of the LED. An area of the emission aperture is smaller than a surface area of the LED, and the area of the emission aperture is roughened.

It is understood that other aspects of the present invention will become readily apparent to those skilled in the art from the following detailed description, which shows and describes exemplary aspects of the invention by way of illustration. As will be realized, the invention includes other and different aspects and its several details are capable of modification in various other respects, all without departing from the spirit and scope of the present invention. Accordingly, the drawings and detailed description are to be regarded as illustrative in nature and not as restrictive.

BRIEF DESCRIPTION OF THE FIGURES

Various aspects of the present invention are illustrated by way of example, and not by way of limitation, in the accompanying drawings, wherein.

DETAILED DESCRIPTION

The detailed description set forth below in connection with the appended drawings is intended as a description of various aspects of the present invention and is not intended to represent all aspects in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention.

In the following detailed description, various aspects of LEDs will be described. However, as those skilled in the art will readily appreciate, the various aspects presented throughout this disclosure are likewise applicable to many LED structures, including by way of example, LEDs with vertical structures, lateral structures, flip-chip structures, and the like.

Figure 1:
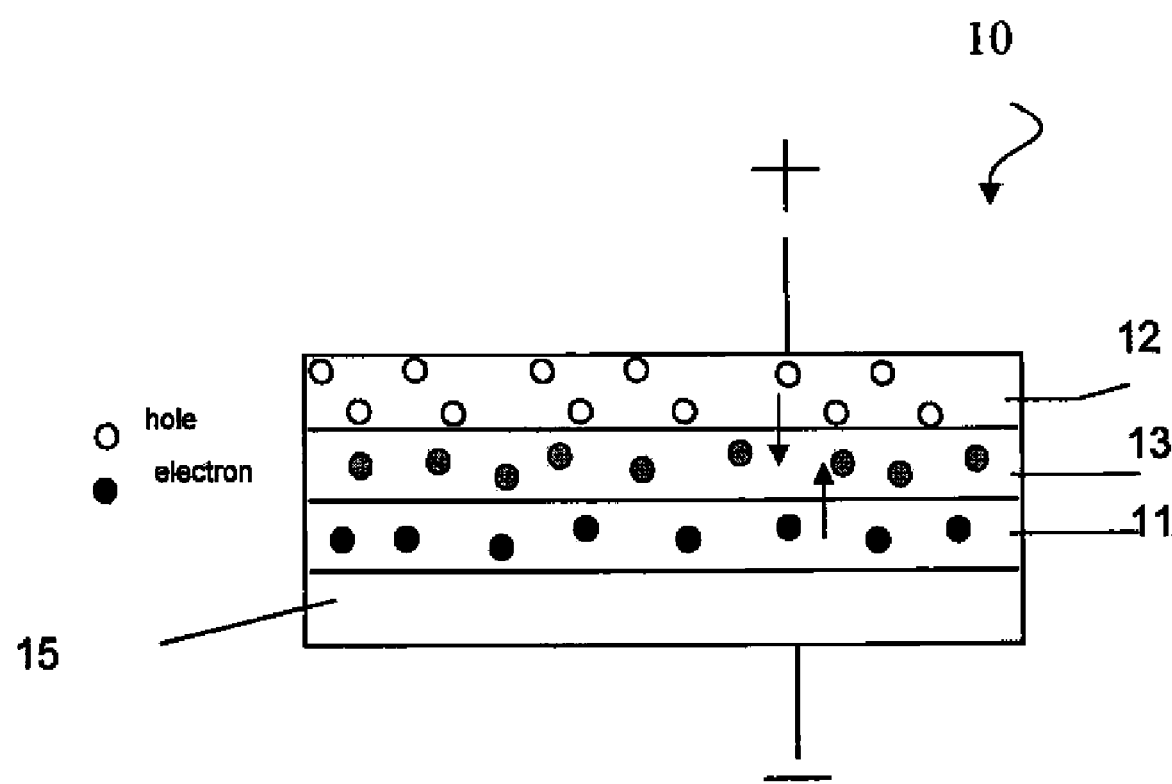
FIG. 1 illustrates a general LED structure.

FIG. 1 shows a typical configuration of an LED chip 10 that includes three semiconductor layers deposited on a substrate. Among these three semiconductor layers, an active region 13 is formed between an n-type semiconductor layer 11 that is formed on a substrate 15 and a p-type semiconductor layer 12. When a current is applied to the LED chip 10, holes generated by the p-type semiconductor layer 11 and electrons generated by the n-type semiconductor layer 11 flow into the active region 13 and combine therein, so that the active region 13 emits light. When used, the LED chip 10 is packaged and connected with a power source and an emission aperture is formed on one surface of the LED chip 10 so that the light generated by the LED chip 10 emits from the emission aperture. In general, the width of the emission aperture is equal or larger than an area of the surface of the LED chip 10 where the emission aperture is formed.

The light emitting from the active region 13 has a probability of propagating toward the top surface or the bottom surface of the LED chip 10. To direct the light emitted to the bottom of the LED chip 10 back to the top surface (i.e., the surface where the light is emitted out) a reflective layer is used on the bottom surface for this purpose. Furthermore, the reflectivity of the reflective layer (will be shown in FIGS. 2-5) is made to be as high as possible, i.e., the reflective layer is a very low loss reflector, to reduce reflection loss, since the light emission tends to be reflected multiple times before escaping the LED chip 10. Moreover, if an incident angle of light at the interface between semiconductor layers of the LED chip 10 and an exit medium is greater than a critical angle, a substantial portion of light generated inside the LED chip is likely to get trapped inside the LED device due to total-internal-reflection (TIR).

It is desired to reduce the width of the emission aperture to be smaller than the area of the surface of the LED chip 10. As described above, the luminance of a source is defined as $L=\Phi/(A\Omega)$, wherein $\Phi$ is the optical power, A is an area of the source, and $\Omega$ is a solid angle of light emission. When the emission aperture is reduced, the area of the light source (A) is also reduced. As the total emitting area inside the LED is constant and therefore the optical power emitted inside the LED is also constant. Assuming the emitted optical power is able to escape through the smaller emission aperture and as the solid angle of the light emission $\Omega$ is fixed, the luminance (L) will be increased.

Figure 2:
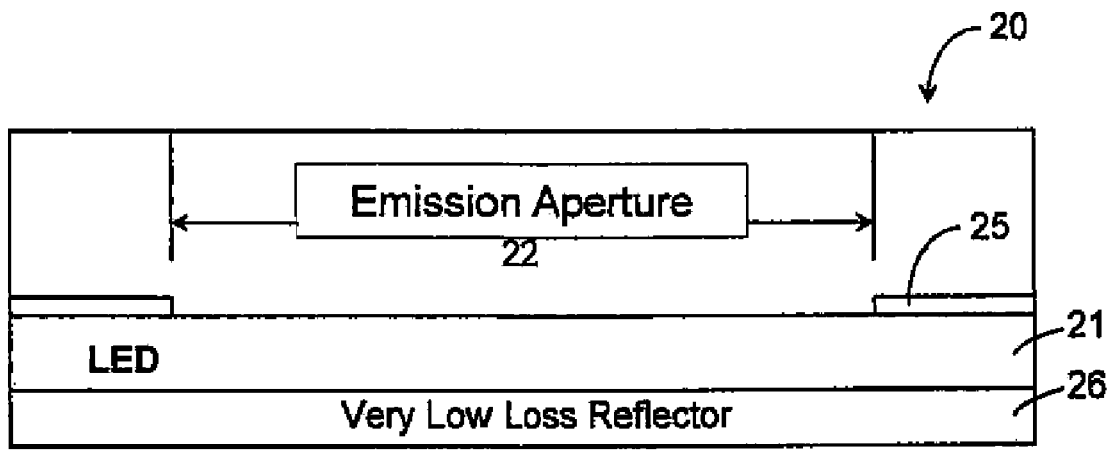
FIG. 2 is a diagram showing a configuration of an LED chip and an emission aperture.

FIG. 2 illustrates an exemplary LED structure 20 in which an emission aperture area 22 is smaller than the total original surface of an LED 21. To make the emission aperture, a low loss reflector 25 may be formed on a top surface or a surface of the LED 21 wherein the emission aperture 22 is formed in a way such that the emission aperture area 22 is smaller than the original surface area of the LED 21. Further, another low loss reflector 26 may also be formed on a bottom surface of the LED 21 to increase the chance of the light emitted from the emission aperture area 22. The effectiveness of such a structure is dependent on the losses inside the LED.

Figure 3:
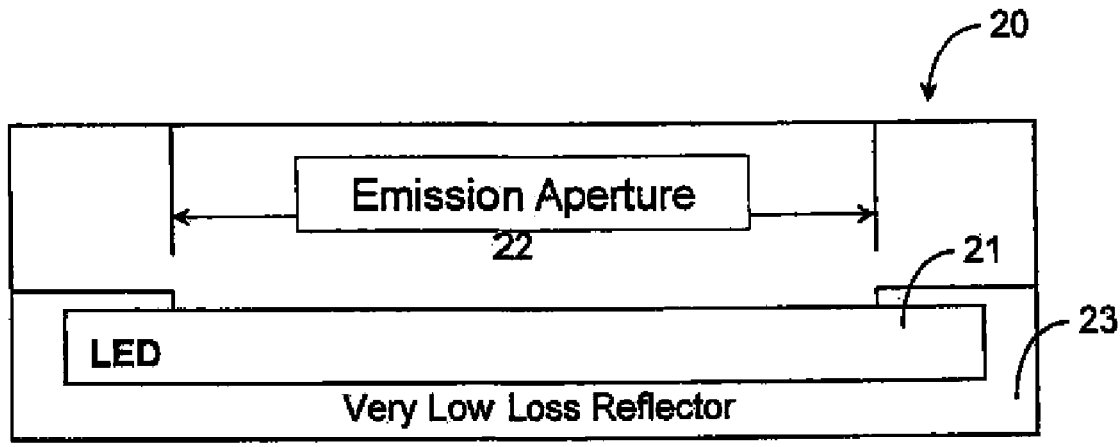
FIG. 3 is a diagram showing another configuration of an LED chip and an emission aperture.

Alternatively, FIG. 3 shows that the LED 21 may be "wrapped" by a low loss reflector 23 on a bottom surface, side walls and portions of the LED 21, leaving an emission aperture area 22 smaller than the original surface area of the LED 21. Similar to FIG. 1, the effectiveness of such a structure is dependent on the losses inside the LED 21. Therefore, the reflectors 25 and 26 in FIG. 2 and 23 in FIG. 3 are very low loss reflectors. Materials suitable for the reflectors 23, 25, and 26 may include Silver and dielectric materials or combinations thereof.

Figure 4:
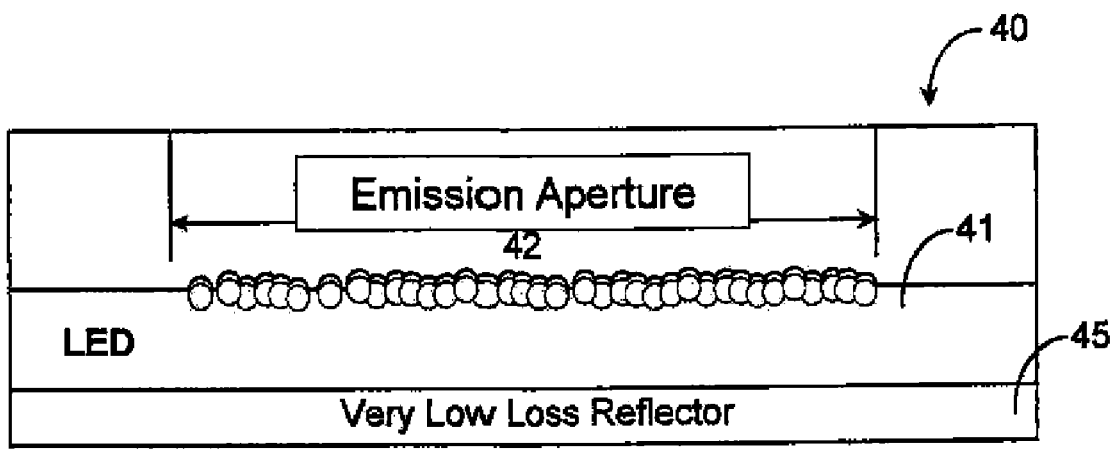
FIG. 4 is a diagram showing an alternative configuration of an LED chip and an emission aperture.

FIG. 4 shows an alternative structure of an LED structure 40 including an LED 41 and an emission aperture area 42, in which a reflector 45 is formed on a bottom surface of the LED 41, but not on the side walls and top surface of the LED 41. As described above, the effectiveness of this approach highly depends on the losses of the LED 41. A natural zero loss reflector, for high angles of an incident light, can be achieved simply by total-internal-reflection (TIR). When an incident angle of light at an interface between semiconductor layers of the LED and an exit medium is greater than a critical angle, 100% reflection is achieved. Under such a situation, a substantial portion of light generated inside the LED is likely to become trapped inside the LED. To increase the chance of light escaping from the LED device, a portion of the top surface of the LED device is randomly roughened to break up the effect of the TIR.

The top surface of the LED 21 is selectively roughened in emission aperture area 42 but the rest of the top surface, for example, those beyond the emission aperture area 42, is smooth. The smooth surface of the LED 40 naturally forms a low loss reflector. The roughened area of the LED 41 increases the chance of the light escaping from the LED 41.

Figure 5:
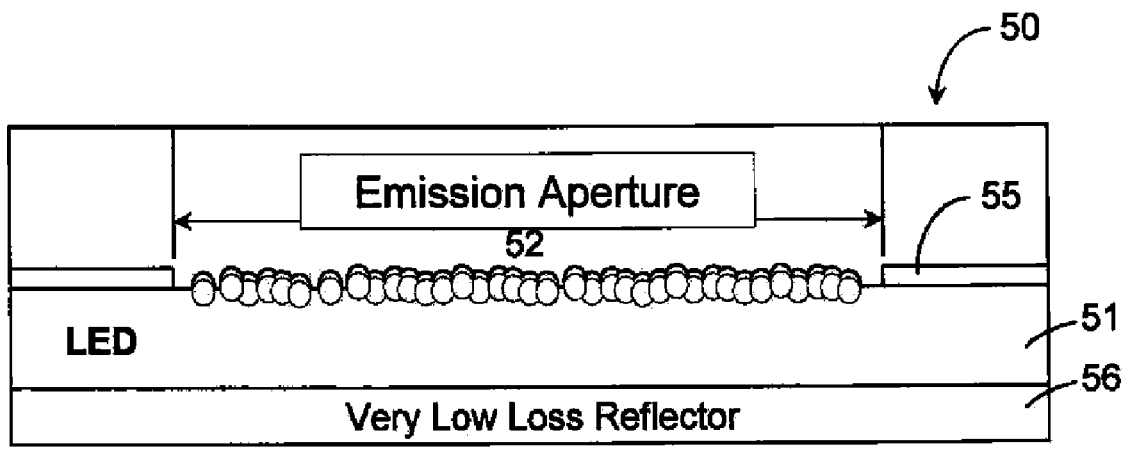
FIG. 5 is diagram showing a yet another configuration of an LED and an emission aperture.

FIG. 5 illustrates another alternative design of an LED structure 50. In this figure, instead of leaving the areas of the top surface of an LED 51 beyond an emission aperture area 52 smooth, these areas may also be covered by a very low loss reflector 55, as illustrated in FIG. 2.

Figure 6:
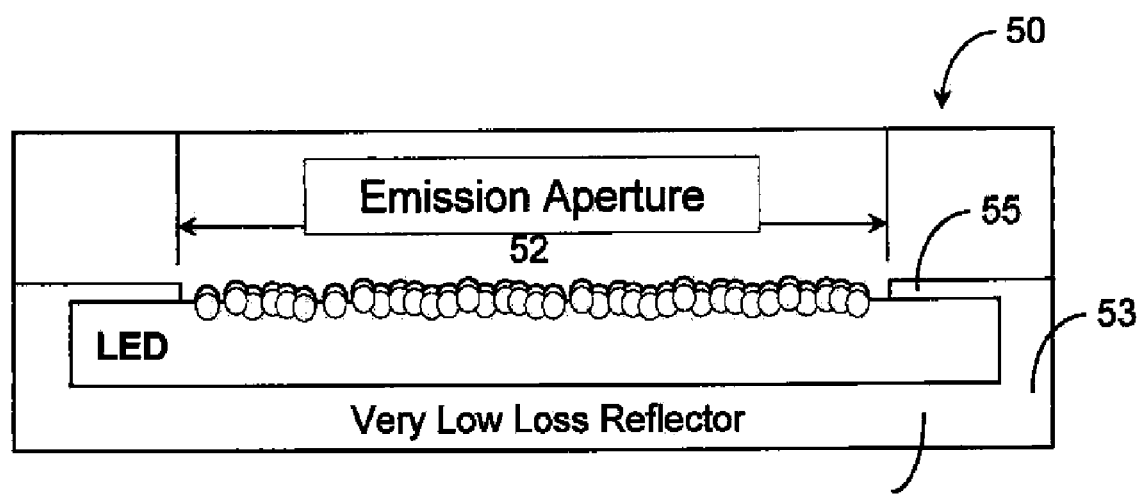
FIG. 6 is diagram showing a still another configuration of an LED and an emission aperture.

FIG. 6 shows that the structure of FIG. 5 can also be modified by covering another low loss reflector 53 on the side walls of the LED 51, similar to the structure shown in FIG. 3.

According to an aspect of the disclosure, the LED with increased brightness and power in a defined aperture area may be manufactured without major changes in the conventional manufacturing process. For example, in the configuration of FIGS. 2 and 3, the reflector 25 and 26 surrounding the LED 21 may be selected from materials with very low reflection such as silver or dielectric materials or their combination, and the location of the reflector 25 beyond the emission aperture 22 may be controlled by a photoresist during the step of forming the reflector 25. In the configuration of FIG. 4, the roughened surface of the LED 41 may be achieved by conventional roughening processes, and the area of the roughened surface may be controlled by covering the areas that need not be roughened with the photoresist. These methods, however, are for exemplary purpose and are not limiting, as other method that achieve similar result may also be used.

Furthermore, the size of the emission aperture area can be reduced to an extent until the brightness is saturated, i.e., no more increase in brightness can be obtained. The limitation of the size varies based on the conditions of the LED structure or by simulation/trial-and-error methods.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A light emitting semiconductor device comprising:
   an LED having an emission aperture located on a top surface of the LED, the LED having two side walls, a bottom surface, and the top surface; and
   a reflector contacting the LED to surround the LED on the two side walls, the bottom surface, and portions of the top surface,
   wherein an area on the top surface uncovered by the reflector is the emission aperture and the emission aperture has a size that is smaller than a surface area of the LED where the emission aperture is formed.

2. The light emitting semiconductor device of claim 1, wherein the reflector is selected from one of silver, dielectric materials, and combinations thereof.

3. The light emitting semiconductor device of claim 1, wherein the surface of the LED substantially aligned with the emission aperture is roughened.

4. The light emitting semiconductor device of claim 3, wherein the surface of the LED beyond the emission aperture is smooth.

5. The light emitting semiconductor device of claim 4, wherein the reflector is a low loss reflector.

6. The light emitting semiconductor device of claim 4, wherein the smooth surface forms a total-internal reflection (TIR) area.

7. A light emitting semiconductor device, comprising
an LED having two side walls, a bottom surface, a top surface, and an emission aperture located on the top surface of the LED; and
a reflector formed on the bottom surface, the two side walls, and portions of the top surface of the LED, wherein an area on the top surface uncovered by the reflector forms the emission aperture and is smaller than an area of the LED.

8. The light emitting semiconductor device of claim 7, wherein the reflector is selected from one of silver and dielectric materials.

9. A light emitting semiconductor device, comprising:
an LED having an emission aperture located on a surface of the LED; and
a reflector contacting surfaces of the LED other than the emission aperture to surround the LED,
wherein an area of the emission aperture is smaller than a surface area of the LED, and the emission aperture is roughened.

10. The light emitting semiconductor device of claim 9, wherein the surface of the LED beyond the emission aperture is smooth.

11. The light emitting semiconductor device of claim 10, wherein the smooth surface forms a total-internal reflection (TIR) area.

12. The light emitting semiconductor device of claim 10, wherein the reflector is a low loss reflector.

* * * * *